United States Patent [19]

Molochnikov et al.

[11] 4,136,313
[45] Jan. 23, 1979

[54] APPARATUS FOR MEASURING Q-QUALITY OF OSCILLATORY CIRCUIT COMPONENTS

[76] Inventors: Viktor V. Molochnikov, ulitsa Olshevskogo, 11, kv. 7; Vasily I. Efimov, ulitsa Zhudro, 4, kv. 116; Anatoly S. Veraxo, 3 Mozhaisky pereulok, 53, kv. 1; Evgeny M. Savitsky, prospekt Rokossovskogo, 156, kv. 242, all of Minsk, U.S.S.R.

[21] Appl. No.: 837,849

[22] Filed: Sep. 29, 1977

[30] Foreign Application Priority Data

Oct. 1, 1976 [SU] U.S.S.R. ................. 2408263

[51] Int. Cl.$^2$ .......................................... G01R 27/00
[52] U.S. Cl. .................................................. 324/57 R
[58] Field of Search ........................... 324/57 R, 57 Q

[56] References Cited

U.S. PATENT DOCUMENTS

| | | | |
|---|---|---|---|
| 3,824,458 | 7/1974 | Martyashin et al. | 324/57 R |
| 3,843,925 | 10/1974 | Martyashin et al. | 324/57 R |
| 3,846,699 | 11/1974 | Martyashin et al. | 324/57 R |
| 3,848,186 | 11/1974 | Martyashin et al. | 324/57 R |

*Primary Examiner*—Stanley T. Krawczewicz

*Attorney, Agent, or Firm*—Lackenbach, Lilling & Siegel

[57] ABSTRACT

An apparatus for measuring the Q-quality of oscillatory circuit components includes a control unit electrically coupled to a high-frequency generator connected to a frequency modulator having its output connected to a measuring unit. The measuring unit is electrically coupled to the oscillatory circuit components whose Q-quality is to be measured. The apparatus includes a unit for producing the first frequency derivative of the amplitude-frequency response of the oscillatory circuit, said unit being connected to a third control unit, and a unit for producing the second frequency derivative of the amplitude-frequency response of the oscillatory circuit, said unit being also connected to said third control unit. The third control unit is connected to a peak detector, to an electronic switch, to a first and second memory units, and to the drive input of the frequency modulator.

The proposed apparatus offers high accuracy of measuring the Q-quality and is completely free of errors due to the frequency dependence of the transfer ratios of the measuring unit coupling elements.

2 Claims, 7 Drawing Figures

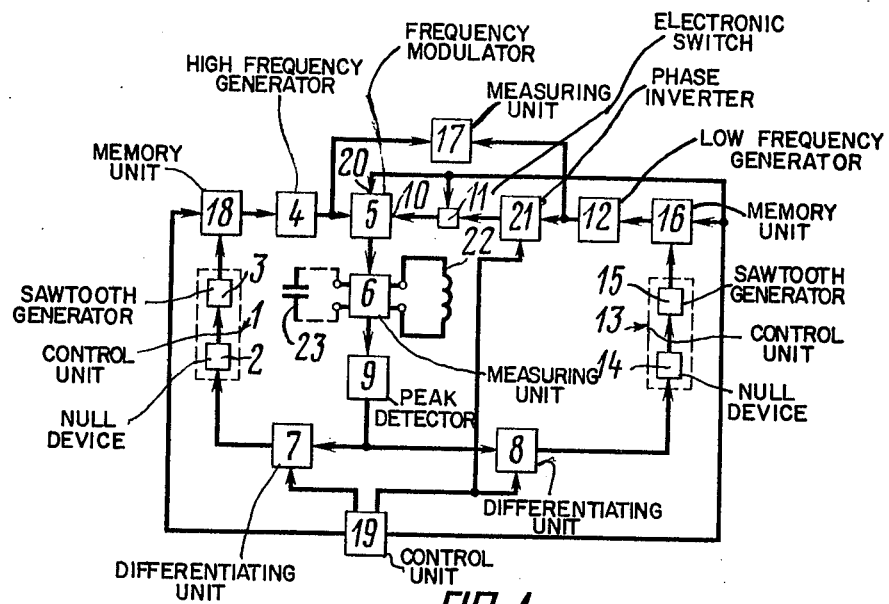
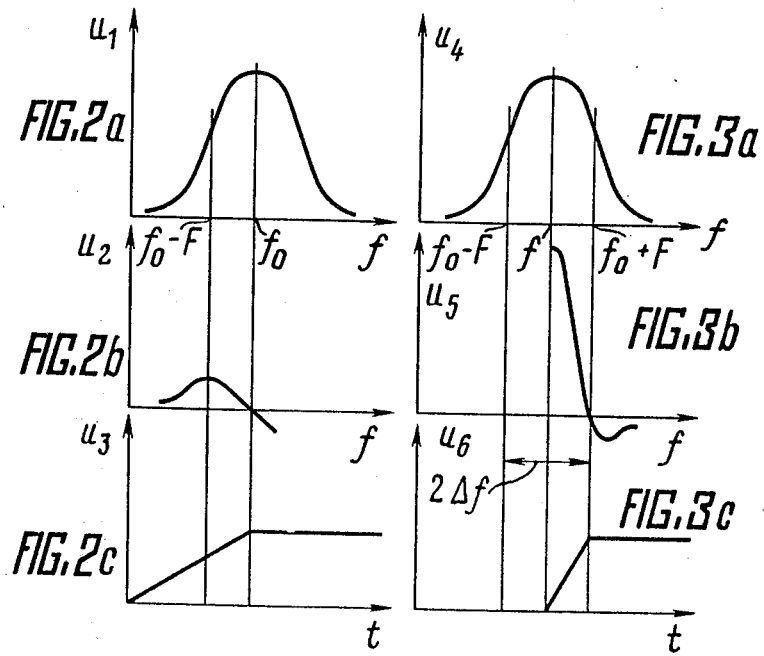

APPARATUS FOR MEASURING Q-QUALITY OF OSCILLATORY CIRCUIT COMPONENTS

FIELD OF THE INVENTION

The present invention relates to instruments for measuring parameters of radio circuits, and more particularly to an apparatus for measuring the Q-quality of oscillatory circuit components.

The apparatus according to the present invention is mainly used for measuring "Q" of inductors and tangent of loss angle in capacitors, as well as for measuring the active resistance, capacitance, inductance and tangent of loss angle in dielectric materials. The apparatus can likewise be used for measuring parameters of linear and nonlinear radio components.

BACKGROUND OF THE INVENTION

The instruments currently used for measuring Q-quality of oscillatory circuit components in ultra short wave and microwave ranges are, as a rule, manually operated, thus failing to provide for high accuracy of measurements, and are intended only for linear oscillatory circuit components.

With this in view, there has developed a demand for a high-precision automatic digital Q-meter that would measure with higher accuracy parameters of both linear and nonlinear radio components in low and moderate electromagnetic fields, and provide for high-speed operation.

Known in the art is an apparatus for measuring the Q-quality of oscillatory circuit components (cf. USSR Inventor's Certificate No. 519,650; Cl. G01R 27/26) which includes a control unit whose sawtooth generator is electrically coupled to a high-frequency generator connected to a frequency modulator, the output of which is connected to a measuring unit electrically coupled, in turn, to the oscillatory circuit components whose Q-quality is to be measured, and a unit for producing the first frequency derivative of the amplitude-frequency response of the oscillatory circuit, said unit being connected to the control unit null device connected in series with the control unit sawtooth generator, to a unit for producing the second frequency derivative of the amplitude-frequency response of the oscillatory circuit, and to a peak detector connected, in turn, to the measuring unit.

The apparatus also includes a step voltage generator connected to the units for producing the first and second frequency derivatives of the amplitude-frequency response of the oscillatory circuit and electrically coupled to the frequency modulator. Furthermore, the apparatus includes an amplifier, the drive input of which is connected to the step voltage generator and the output, to the drive input of the frequency modulator, while another input thereof is electrically coupled to the unit for producing the second frequency derivative of the amplitude-frequency response of the oscillatory circuit. Also included in the apparatus are an attenuator connected to the unit for producing the second frequency derivative of the amplitude-frequency response of the oscillatory circuit and electrically coupled to the amplifier input, a subtracting unit connected, in turn, to the amplifier, attenuator and to the units for producing the first and second frequency derivatives of the amplitude-frequency response of the oscillatory circuit, the output of the subtracting unit being electrically coupled to a Q-readout unit.

The apparatus fails to provide for high accuracy of measuring the Q-quality in a wide frequency range because of the frequency dependence of transfer ratios of the measuring unit coupling elements and due to errors associated with maintaining the measuring unit input voltage constant, since the second frequency derivative of the amplitude-frequency response, of the oscillatory circuit in said apparatus is used as an absolute analog value for measuring the Q-quality and depends on the transfer ratios of coupling elements and on the absolute value of the input voltage of the measuring unit.

SUMMARY OF THE INVENTION

It is an object of the present invention to increase the accuracy of measuring the Q-quality of oscillatory circuit components.

This object, and others which will become evident from the description that follows, is attained by an apparatus for measuring the Q-quality of oscillatory circuit components, comprising a control unit whose sawtooth generator is electrically coupled to a high-frequency generator connected to a frequency modulator, the output thereof being connected to a measuring unit electrically coupled, in turn, to the oscillatory circuit components whose Q-quality is to be measured, and a unit for producing the first frequency derivative of the amplitude-frequency response of the oscillatory circuit, this unit being connected to a control unit null device connected in series with the control unit sawtooth generator, to a unit for producing the second frequency derivative of the amplitude-frequency response of the oscillatory circuit, and to a peak detector connected, in turn, to the measuring unit. According to the present invention, there are provided a low-frequency generator electrically coupled via an electronic switch to the frequency modulator, a second control unit having a null device connected in series with a sawtooth generator, a memory unit connected to the sawtooth generator of the second control unit and to the low-frequency generator, a unit for measuring the frequency ratio, connected to the low-frequency and high-frequency generators, a second memory unit electrically coupling the high-frequency generator to the control unit, and a third control unit connected to the units for producing the first and second frequency derivatives of the amplitude-frequency response of the oscillatory circuit, to the electronic swith, to the first and second memory units, and to the drive input of the frequency modulator.

Advantageously, the apparatus should have a phase inverter electrically coupling the low-frequency generator to the frequency modulator and having its drive input connected to the third control unit.

The proposed apparatus offers higher accuracy of measuring the Q-quality, since the measuring error is now determined only by the error of measuring frequencies. In addition, the apparatus ensures that both branches of the amplitude-frequency response curve are investigated at the same time, thus eliminating errors of measuring small Q-values due to the asymmetry of the amplitude-frequency response of the oscillatory circuit. Since the measuring error due to the frequency dependence of the transfer ratios of the measuring unit coupling elements is entirely eliminated in the proposed apparatus, the accuracy of measuring the Q-quality, especially in a high frequency range, is increased by 20% as compared with the existing instruments.

BRIEF DESCRIPTION OF THE DRAWINGS

An embodiment of the invention will now be described with reference to the accompanying drawings, in which:

FIG. 1 is a block diagram of the proposed apparatus for measuring the Q-quality of oscillating circuit components, according to the present invention;

FIG. 2 (a, b, c) illustrates signals at the outputs of the units of the apparatus in the mode of tuning to the resonance frequency, according to the present invention; and FIG. 3 (a, b, c) illustrates signals at the outputs of the units of the apparatus in the mode of selecting the frequency passband, according to the present invention.

DETAILED DESCRIPTION OF THE INVENTION

The apparatus for measuring the Q-quality of oscillatory circuit components includes a control unit 1 (FIG. 1) having a null device 2 and a sawtooth generator 3 connected in series. The generator 3 is electrically coupled to a high-frequency generator 4 connected to a frequency modulator 5 whose output is connected to a measuring unit 6 electrically coupled to the oscillatory circuit components whose Q-quality is to be measured. The frequency modulator 5 is in the form of a balanced frequency modulator.

The apparatus also includes a unit 7 for producing the first frequency derivative of the amplitude-frequency response of the oscillatory circuit, said unit having its output connected to the null device 2 and its input connected to the input of a unit 8 for producing the second frequency derivative of the amplitude-frequency response of the oscillatory circuit and to the input of a peak detector 9, which input is also connected to the measuring unit 6. A second input 10 of the frequency modulator 5 is electrically coupled via an electronic switch 11 to a low-frequency generator 12. Additionally, the apparatus includes a second control unit 13 having a null device 14 and a sawtooth generator 15 connected in series. Also provided in the apparatus is a memory unit 16 connected to the sawtooth generator 15 and to the low-frequency generator 12. The memory unit 16 uses a well known circuit configuration. Besides, the apparatus includes a unit 17 for measuring the frequency ratio, having likewise a well known circuit configuration and connected to the low-frequency and high-frequency generators 12 and 4, respectively. Furthermore, the apparatus includes a memory unit 18 similar to the unit 16 and electrically coupling the high-frequency generator 4 to the control unit 1. The apparatus also includes a third control unit 19 having a series circuit of a multivibrator and a frequency divider, the outputs of the unit 19 being connected to the inputs of the units 7 and 8 for producing, respectively, the first and second frequency derivatives of the amplitude-frequency response of the oscillatory circuit, to the input of the electronic switch 11, to the inputs of the first and second memory units 16 and 18, respectively, and to the drive input 20 of the frequency modulator 5.

Additionally, the apparatus includes a phase inverter 21 electrically coupling the low-frequency generator 12 to the frequency modulator 5 and having its drive input connected to the third control unit 19.

When measuring the Q-quality of an inductor 22, the latter is connected directly to the measuring unit 6. When measuring the Q-quality of a capacitor 23, the latter is connected to the measuring unit 6 together with a matched inductor placed instead of the inductor 22.

The operation of the proposed apparatus can be better understood with reference to FIGS. 2 and 3, in which voltages at the outputs of the circuit elements are plotted versus frequency. Thus, plots in FIG. 2 represent the operation of the apparatus in the mode of tuning the high-frequency generator 4 to the resonance frequency of the oscillatory circuit, wherein FIG. 2a depicts voltage $U_1$ at the output of the peak detector 9, FIG. 2b depicts voltage $U_2$ at the output of the unit 7 of producing the first derivative, and FIG. 2c depicts voltage $U_3$ at the output of the memory unit 18. Plots in FIG. 3 represent the operation of the apparatus in the mode of selecting the frequency passband between inflection points of the amplitude-frequency response curve of the oscillatory circuit, wherein FIG. 3a depicts voltage $U_4$ at the output of the peak detector 9, FIG. 3b depicts voltage $U_5$ at the output of the unit 8 of producing the second derivative, FIG. 3c depicts voltage $U_6$ at the output of the memory unit 16.

The proposed apparatus operates as follows. In the mode of searching for the resonance frequency, the control unit 19 (FIG. 1) opens the memory unit 18 for a predetermined time, closes the memory unit 16 and electronic switches 11, and puts the frequency modulator 5 into the mode of selecting for high-frequency. Meanwhile, the sawtooth generator 3 produces voltage $U_3$ (FIG. 2c) varying linearly with time. This voltage causes to a variation in the frequency of the output voltage of the high-frequency generator 4, this output voltage being delivered via the frequency modulator 5 to the input of the measuring unit 6. When the components to be measured, i.e., the inductor 22 and capacitor 23, are connected to the measuring unit 6, the latter becomes an oscillatory circuit.

The voltage of high varying frequency, while passing through the oscillatory circuit and peak detector 9, is converted into voltage $U_1$ (FIG. 2a) varying with time and corresponding to the amplitude-frequency response of the oscillatory circuit.

The unit 7 (FIG. 1) driven by the unit 19 differentiates the voltage $U_1$ so that voltage $U_2$ (FIG. 2b) is developed at its output, the voltage $U_2$ being proportional to the first frequency derivative of the amplitude-frequency response of the circuit.

The voltage $U_2$ drives the null device 2 (FIG. 1) which, in turn, drives the sawtooth generator 3 so that upon passage of the voltage $U_2$ (FIG. 2b) through zero, the null device establishes constant voltage $U_3$ (FIG. 2c) at the output of the generator 3, said constant voltage holding a frequency of the output voltage of the high-frequency generator 4 (FIG. 1) which is equal to the natural resonance frequency of the oscillatory circuit.

In the mode of selecting the frequency passband, the control unit 19 closes the memory unit 18 for a predetermined time, opens the unit 16 and electronic switch 11, and puts the frequency modulator 5 into the mode of selecting the side (sum of difference) frequency. During this time, the memory unit 18 stores voltage $U_3$ (FIG. 3c) and, therefore, a frequency of the output voltage of the high-frequency generator 4 (FIG. 1) which is equal to the natural resonance frequency of the oscillatory circuit.

Meanwhile, the sawtooth generator 15 produces voltage $U_6$ (FIG. 3c) linearly varying with time. This voltage $U_6$ causes a change in the frequency of the output voltage of the low-frequency generator 12 (FIG. 1), said output voltage being delivered via the phase inverter 21 and electronic switch 11 to the input of the frequency modulator 5.

Under the combined action of two voltages with frequencies $f_o$ and F on the frequency modulator 5, the latter develops an output voltage with a frequency determined from the expression:

$$f = f_o \pm F \quad (1)$$

where $f_o$ is the frequency of the high-frequency generator; and

F is the frequency of the low-frequency generator.

Upon passage through the oscillatory circuit and peak detector, the voltage of high varying frequency is converted into voltage $U_4$ (FIG. 3a) varying with time and corresponding to the amplitude-frequency response of the oscillatory circuit under measurement. The unit 8 (FIG. 1) driven by the unit 19 differentiates voltage $U_4$ (FIG. 3a) so that voltage $U_5$ (FIG. 3b) is developed at its output, the voltage $U_5$ being proportional to the second frequency derivative of the amplitude-frequency response of the oscillatory circuit.

The voltage $U_5$ drives the null device 14 (FIG. 1) which, in turn, drives the sawtooth generator 15 and establishes constant voltage $U_6$ (FIG. 3c) at the output thereof upon passage of voltage $U_5$ through zero, the voltage $U_6$ holding the output voltage frequency of the low-frequency generator 12 (FIG. 1) which is half as much as the frequency passband of the oscillatory circuit between the inflection points of its amplitude-frequency response curve.

The phase inverter 21 driven by the unit 19 provides simultaneous sampling for both branches of the amplitude-frequency response so that when measuring small Q-values, it is an average value of the half passband for the left and right branches of the amplitude-frequency response curve that is determined.

Switching from the mode of searching the resonance frequency over to the mode of selecting the passband is accomplished by the control unit 19 through time intervals of predetermined duration. The Q-quality is determined as the frequency ratio from the expression:

$$Q = 0.707 \cdot \frac{f_o}{2 \cdot \Delta f} = 0.707 \cdot \frac{f_o}{2F} \quad (2)$$

The "Q" is directly measured by the unit 17 for measuring the frequency ratio. The unit 17 also measures a given operating frequency at which Q-measurements are being performed, the operating frequency being set by a variable capacitor of the measuring unit.

The apparatus proposed herein features higher accuracy of Q-quality measurements, as compared to the prior art measuring devices.

What is claimed is:

1. An apparatus for measuring Q-quality of oscillatory circuit components comprising:
   a first control unit having a null device and a sawtooth generator connected in series;
   a first memory unit having two inputs and an output, said sawtooth generator of said first control unit being connected to said first input of said first memory unit;
   a high-frequency generator having an input connected to said output of said first memory unit;
   a frequency modulator having three inputs and an output a first input of said frequency modulator being connected to said high-frequency generator;
   an electronic switch having two inputs and an output connected to a second input of said frequency modulator;
   a low-frequency generator having an input and an output electrically coupled to said first input of said electronic switch;
   a second memory unit having two inputs and an output connected to said input of said low-frequency generator;
   a second control unit having a null device and a sawtooth generator connected in series, said sawtooth generator of said second control unit being connected to said input of said second memory unit;
   a unit for measuring the frequency ratio, having a first input connected to said output of said low-frequency generator and a second input connected to said output of said high-frequency generator;
   a measuring unit having a first input connected to said output of said frequency modulator, a second input connected to the components of the oscillatory circuit to be investigated, and an output;
   a peak detector having an input connected to said output of said measuring unit and an output;
   a unit for producing the first frequency derivative of the amplitude-frequency response of the oscillatory circuit, said unit having an output connected to said null device of said first control unit, and two inputs;
   a unit for producing the second frequency derivative of the amplitude-frequency response of the oscillatory circuit, said unit having an output connected to said null device of said second control unit, and two inputs;
   a third control unit having a plurality of outputs a first output of which is connected to said first input of said unit for producing the first frequency derivative of the amplitude-frequency response of the oscillatory circuit, a second output of said outputs being connected to said first input of said unit for producing the second frequency derivative of the amplitude-frequency response of the oscillatory circuit, a third output of said outputs being connected to said second input of said electronic switch, to said second input of said second memory unit, and to said third input of said frequency modulator, a fourth output of said outputs being connected to said second input of said first memory unit;
   said output of said peak detector being connected to said second input of said unit for producing the first frequency derivative of the amplitude-frequency response of the oscillatory circuit and to said second input of said unit for producing the second frequency derivative of the amplitude-frequency response.

2. An apparatus as claimed in claim 1, comprising a phase inverter having a drive input connected to said second output of said third control unit, a first output connected to said second input of said electronic switch, and a second output connected to said input of said low-frequency generator and to said first input of said unit for measuring the frequency ratio.

* * * * *